(12) United States Patent
Halsey, IV

(10) Patent No.: US 8,610,690 B2
(45) Date of Patent: Dec. 17, 2013

(54) CAPACITIVE SENSOR AND METHOD FOR MANUFACTURING SAME

(75) Inventor: Eugene L. Halsey, IV, Holland, MI (US)

(73) Assignee: TPK Touch Solutions Inc., Taipei (TW)

( * ) Notice: Subject to any disclaimer, the term of this patent is extended or adjusted under 35 U.S.C. 154(b) by 796 days.

(21) Appl. No.: 12/513,960

(22) PCT Filed: Jul. 24, 2008

(86) PCT No.: PCT/US2008/071034
§ 371 (c)(1),
(2), (4) Date: May 7, 2009

(87) PCT Pub. No.: WO2009/018094
PCT Pub. Date: Feb. 5, 2009

(65) Prior Publication Data
US 2009/0322705 A1      Dec. 31, 2009

Related U.S. Application Data

(60) Provisional application No. 60/952,428, filed on Jul. 27, 2007, provisional application No. 61/048,402, filed on Apr. 28, 2008.

(51) Int. Cl.
*G06F 3/045*      (2006.01)

(52) U.S. Cl.
USPC ........................................ 345/174; 178/18.06

(58) Field of Classification Search
USPC ................................ 345/173, 174; 178/18.06
See application file for complete search history.

(56) References Cited

U.S. PATENT DOCUMENTS

| | | |
|---|---|---|
| 3,020,193 A | 2/1962 | Seek |
| 3,293,743 A | 12/1966 | Barnard |
| 3,415,706 A | 12/1968 | Ettre |
| 4,290,052 A | 9/1981 | Eichelberger et al. |
| 4,318,958 A | 3/1982 | Piatt |
| 4,490,227 A | 12/1984 | Bitter |
| 4,650,557 A | 3/1987 | Bitter |
| 4,655,811 A | 4/1987 | Bitter |

(Continued)

FOREIGN PATENT DOCUMENTS

| WO | WO2008047971 A1 | 4/2008 |
|---|---|---|
| WO | WO 2009/006512 | 1/2009 |

OTHER PUBLICATIONS

International Search Report and Written Opinion dated Oct. 22, 2008 for corresponding PCT Application No. PCT/US2008/071034, filed Jul. 24, 2008.

*Primary Examiner* — Kevin M Nguyen
(74) *Attorney, Agent, or Firm* — Gokalp Bayramoglu; Anna Tsang

(57) ABSTRACT

A touch sensor, such as a capacitive touch sensor, includes a substrate having at least one passageway established therethrough. A first conductive coating is established at a first surface of the substrate, and a conductive element is disposed at the substrate and at least partially through the passageway. The conductive element establishes conductive continuity between the first surface and second or opposite surface of the substrate. The passageway may comprise multiple passageways and is/are established inboard of a perimeter edge of the substrate. The conductive element may include a first conductive material disposed at the first surface and partially into the passageway and a second conductive material disposed at the second surface and partially into the passageway, whereby the conductive materials contact one another in the passageway to establish conductive continuity between the first and second surfaces of the substrate.

17 Claims, 15 Drawing Sheets

(56) References Cited

U.S. PATENT DOCUMENTS

| | | |
|---|---|---|
| 4,786,767 A | 11/1988 | Kuhlman |
| 4,838,656 A | 6/1989 | Stoddard |
| 4,864,084 A | 9/1989 | Cardinale |
| 4,931,782 A | 6/1990 | Jackson |
| 5,011,732 A | 4/1991 | Takeuchi et al. |
| 5,062,198 A | 11/1991 | Sun |
| 5,239,152 A | 8/1993 | Caldwell et al. |
| 5,277,986 A | 1/1994 | Cronin et al. |
| 5,525,264 A | 6/1996 | Cronin et al. |
| 5,538,905 A | 7/1996 | Nishioka et al. |
| 5,604,626 A | 2/1997 | Teowee et al. |
| 5,673,041 A | 9/1997 | Chatigny et al. |
| 5,689,157 A | 11/1997 | Jitsukata et al. |
| 5,719,705 A | 2/1998 | Machol |
| 5,725,957 A | 3/1998 | Varaprasad et al. |
| 5,729,379 A | 3/1998 | Allemand et al. |
| 5,742,118 A | 4/1998 | Endo et al. |
| 5,838,483 A | 11/1998 | Teowee et al. |
| 5,900,275 A | 5/1999 | Cronin et al. |
| 6,001,486 A | 12/1999 | Varaprasad et al. |
| 6,040,939 A | 3/2000 | Demiryont et al. |
| 6,087,012 A | 7/2000 | Varaprasad et al. |
| 6,093,477 A | 7/2000 | Matsufusa et al. |
| 6,163,313 A | 12/2000 | Aroyan et al. |
| 6,261,700 B1 | 7/2001 | Olson et al. |
| 6,277,485 B1 | 8/2001 | Invie et al. |
| 6,344,288 B1 | 2/2002 | Oyama et al. |
| 6,362,414 B1 | 3/2002 | Fujisawa et al. |
| 6,380,480 B1 | 4/2002 | Norimatsu et al. |
| 6,395,863 B2 | 5/2002 | Geaghan |
| 6,440,491 B1 | 8/2002 | Varaprasad et al. |
| 6,444,898 B1 | 9/2002 | Fujisawa et al. |
| 6,488,981 B1 | 12/2002 | Richter et al. |
| 6,549,193 B1 | 4/2003 | Huang et al. |
| 6,620,454 B2 | 9/2003 | Varaprasad et al. |
| 6,627,918 B2 | 9/2003 | Getz et al. |
| 6,706,552 B2 | 3/2004 | Getz et al. |
| 6,727,895 B2 | 4/2004 | Bottari et al. |
| 6,787,240 B2 | 9/2004 | Getz |
| 6,842,171 B2 | 1/2005 | Richter et al. |
| 7,165,323 B2 | 1/2007 | Halsey, IV et al. |
| 7,184,190 B2 | 2/2007 | McCabe et al. |
| 7,255,451 B2 | 8/2007 | McCabe et al. |
| 7,274,501 B2 | 9/2007 | McCabe et al. |
| 7,507,438 B2 | 3/2009 | Cherif et al. |
| 2001/0024685 A1 | 9/2001 | Boulton et al. |
| 2001/0055673 A1 | 12/2001 | Getz |
| 2002/0031622 A1 | 3/2002 | Ippel et al. |
| 2002/0086188 A1 | 7/2002 | Halsey, IV et al. |
| 2004/0137240 A1 | 7/2004 | Halsey, IV et al. |
| 2006/0211044 A1 | 9/2006 | Green |
| 2006/0266640 A1 | 11/2006 | Halsey, IV et al. |
| 2006/0274049 A1* | 12/2006 | Spath et al. .................... 345/173 |
| 2007/0098227 A1 | 5/2007 | Takahashi |
| 2008/0023824 A1* | 1/2008 | Salzman ....................... 257/724 |
| 2009/0001999 A1* | 1/2009 | Douglas ....................... 324/688 |

\* cited by examiner

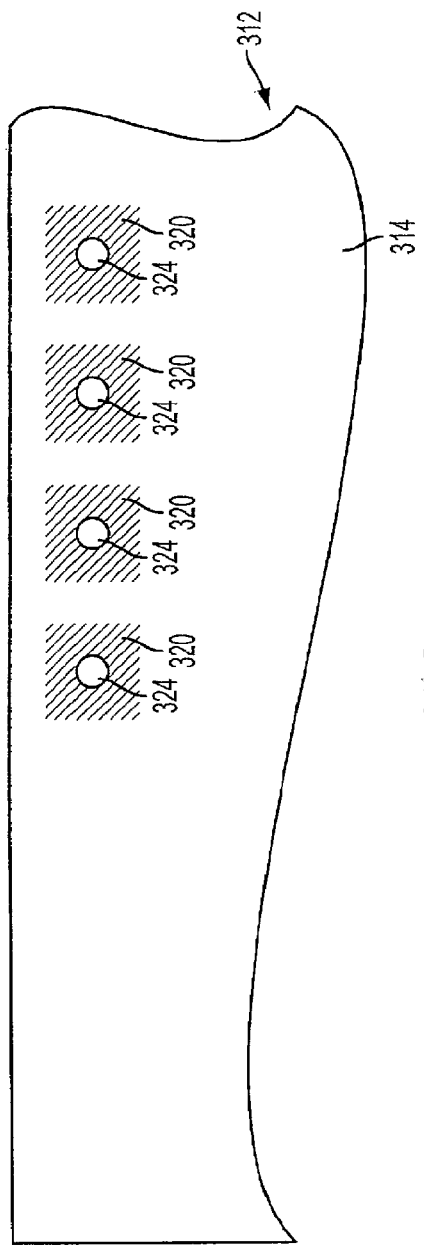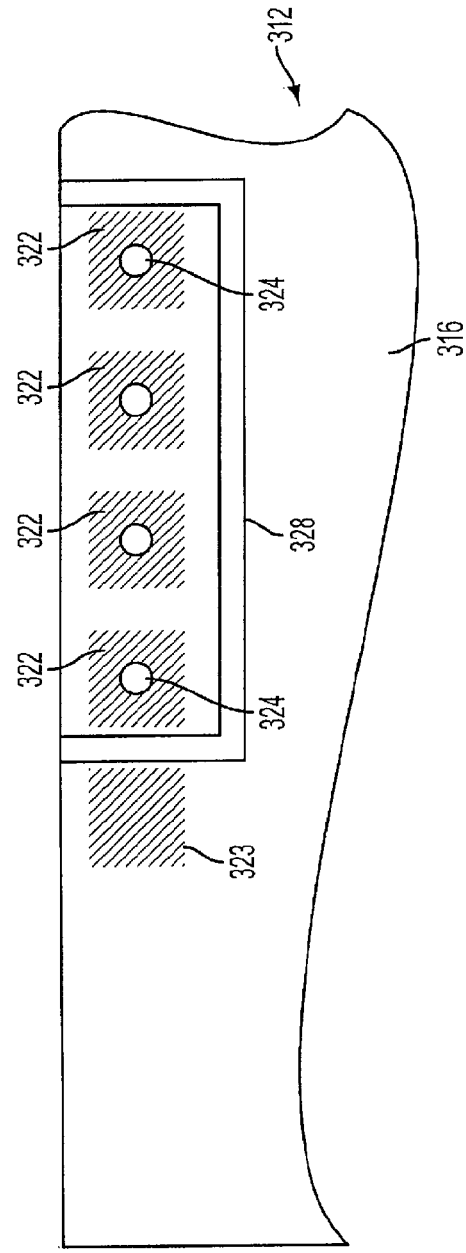

CAPACITIVE SENSOR AND METHOD FOR MANUFACTURING SAME

CROSS REFERENCE TO RELATED APPLICATIONS

The present application is a 371 national phase application of PCT Application No. PCT/US2008/071034, filed Jul. 24, 2008, which claims the benefit of U.S. provisional applications, Ser. No. 60/952,428, filed Jul. 27, 2007; and Ser. No. 61/048,402, filed Apr. 28, 2008, which are hereby incorporated herein by reference in their entireties.

FIELD OF THE INVENTION

The present invention relates generally to capacitive sensors or touch screens and methods for manufacturing capacitive sensors and touch screens.

BACKGROUND OF THE INVENTION

As the use of touch screens, such as for public information kiosks, portable devices, and gaming applications and the like, increases, so does the need for more durable touch screen designs. Use of lamination configurations is a known technique to enhance durability of and add features (such as conductive, anti-glare, and anti-reflective coatings) to the touch screens. For example, using a transparent, conductively coated flexible plastic material, such as transparent conductively coated PET laminated to ultrathin glass (having a glass thickness preferably less than about 0.3 mm in thickness, more preferably less than about 0.2 mm in thickness, most preferably less than about 0.1 mm thickness) as the top sheet in a conventional resistive touch screen design (as shown in FIG. 1) is known in the art of touch screen manufacturing. The coating of flexible PET with a transparent conductive coating, such as by a web coating process, is also common process knowledge.

Typically, touch screens, and in particular capacitive touch screens, are manufactured via a multi-step process that includes multiple high temperature curing stages. For example, a touch screen may be manufactured by first washing a piece of flat glass, screen masking the glass surface where no conductive coating is desired and coating the glass surface with a transparent conductive coating, such as antimony tin oxide (ATO). The transparent conductive coating is then often fired at a high temperature of about 510 degrees Celsius or higher to improve properties thereof. The coated glass substrate is then washed and a conductive electrode, such as a silver conductive epoxy or paste portion, is printed onto the surface and then this is cured at a high temperature, such as about 480 degrees Celsius or higher. The glass is washed again and a hardcoat layer (such as an inorganic oxide, such as silicon dioxide) may be coated, such as by spraying, onto the glass, or the glass may be dipped into a precursor solution of the hardcoat coating. The hardcoat is then cured at a high temperature, such as about 520 degrees Celsius or thereabouts. A protective border layer may then be screened over the silver and may then be cured, such as via an ultraviolet (UV) curing process or, where a glass frit may be used, via another high temperature firing process. The glass is then cut to its final size and the edges are seamed before the touch screen is washed and packaged for shipping. The conductive coating is preferably antimony tin oxide due to the stability and uniformity of ATO during the multiple heat curing processes. Examples of such coatings and sensors or touch screens are described in U.S. Pat. Nos. 6,488,981; 6,549,193; 6,727,895; and 6,842,171, which are hereby incorporated herein by reference in their entireties.

It is known that in interactive information devices such as touch panels and pen-input devices, there is usually at least one rigid glass substrate coated with a transparent conductive coating such as indium tin oxide (ITO) or doped tin oxide. Depending on the coating deposition process, the transparent conductive coating may need to be further oxidized to achieve optimum transparency and further reduced to achieve optimum electrical conductivity. This curing process requires elevated temperature in a forced dry air environment followed by the introduction of an inert atmosphere forming gas. It is also known that in interactive information devices such as touch panels and pen-input devices, there are usually thick film electrode patterns deposited on the conductive films. These thick film electrode patterns, typically silver frit compounds, also need to be thermally bonded to the conductive thin film and the glass substrate under the conductive thin film.

SUMMARY OF THE INVENTION

The present invention provides a plastic capacitive sensor or touch screen. The sensor or touch screen includes a substrate coated with a conductive coating and with a pattern of electrodes disposed thereon.

According to an aspect of the present invention, construction of the touch screen includes an ITO (or other suitable transparent conductive coating) on an acrylic, polycarbonate or cyclic olefin or other plastic or polymeric substrate or media, a low temperature silver ink, and an antiglare (AG) coated thin glass (or clear thin glass) as the hardcoat. The thin glass may be laminated to the ITO coated plastic (such as by utilizing aspects of the devices and processes described in U.S. Pat. No. 7,165,323, which is hereby incorporated herein by reference in its entirety). Optionally, the touch screen may include a dark or light absorbing (such as a metallic material) or dark colored or black mask layer printed on the inside of the AG top glass that would hide the electrode pattern on the ITO coated plastic substrate.

According to another aspect of the present invention, a flush-mountable touch sensor includes a substrate (such as a glass or plastic substrate) that is coated with a conductive coating (such as ITO or the like). The substrate may have passageways or vias formed or established or drilled through the substrate, such that the metallic material (such as silver) of the patterned electrodes disposed at the surface of the substrate flows into the vias and establishes conductive continuity through the substrate and between the front surface of the substrate and the rear surface of the substrate. Thus, the metallic conductive material in the vias allows for electrical connection to the conductive coating on the front surface of the substrate by electrically connecting a cable or electrical circuitry at the rear surface of the substrate, without any additional electrical connector or connectors at the front surface of the substrate.

These and other objects, advantages, purposes and features of the present invention will become more apparent upon review of the following specification in conjunction with the drawings.

BRIEF DESCRIPTION OF THE DRAWINGS

FIG. 7 is a front view of a capacitive sensor of the present invention, showing the silver pads and vias of the sensor;

FIG. 8 is a rear view of the capacitive sensor of FIG. 7, showing a deletion area to electrically isolate the vias;

DESCRIPTION OF THE PREFERRED EMBODIMENTS

Figure 1:
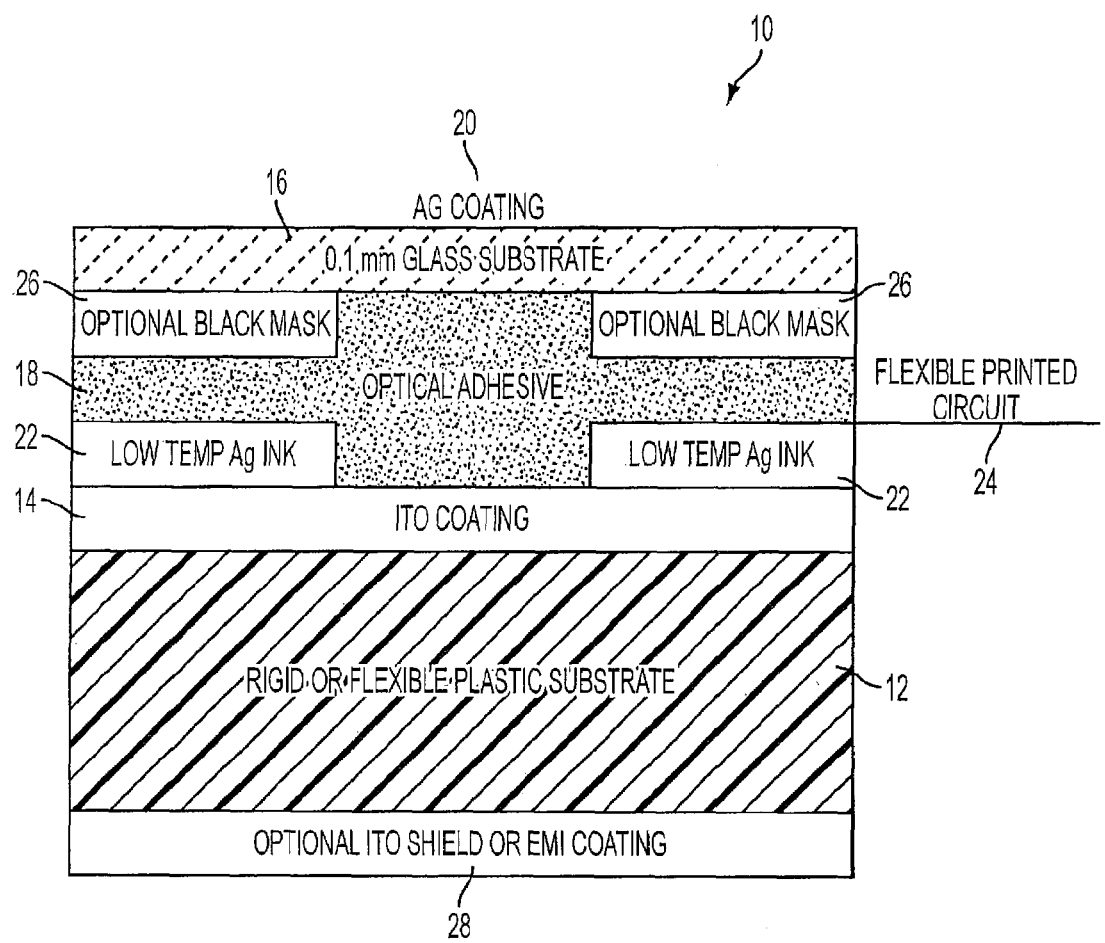
FIG. 1 is a sectional view of a touch screen in accordance with the present invention.

Referring now to the drawings and the illustrative embodiments depicted therein, a touch screen 10 in accordance with the present invention is shown in FIG. 1. In the illustrated embodiment, touch screen 10 includes a rigid or flexible substrate 12 (such as a plastic or polymeric substrate or the like) with a transparent conductive layer 14 (such as a coating or layer of indium tin oxide (ITO) or the like) disposed on a surface thereof, and an ultra-thin glass substrate 16 (such as an ultra-thin glass substrate having a thickness of about 0.1 mm or thereabouts), with an optical adhesive 18 disposed and sandwiched between the substrate 12 and the ultra-thin glass substrate 16 to adhere the ultra-thin glass substrate to the substrate. The front or outer surface of the ultra-thin glass substrate 16 is coated with an antiglare (AG) coating 20. A conductive coating or conductive ink layer 22 is disposed at the substrate 12 at the surface opposing the optical adhesive 18, and typically as a screened on pattern of electrodes. A flexible printed circuit or circuitry element 24 is connected to the touch screen to make electrical connection between the touch screen and circuitry of the device. The flexible circuit element 24 may comprise a flexible ribbon or cable connector including multiple wires or traces connecting with respective sets of the screened on electrodes. Optionally, a dark masking layer 26 (such as a black mask or paint or the like) may be disposed at the ultra-thin glass substrate 16 (and generally corresponding to regions where the conductive ink layer is disposed). Optionally, a protective coating or shield 28 (such as another ITO coating or similar transparent conductor coating or a similar EMI reducing coating or the like) may be disposed at a rear or back surface of the substrate 12 (the surface opposite the ITO coated surface).

The substrate 12 can be either rigid or flexible, and preferably is plastic. If the plastic substrate is rigid or substantially rigid, the plastic substrate may comprise acrylic, polycarbonate or cyclic olefin materials or other suitable materials (such as by utilizing aspects of the devices described in U.S. patent application Ser. No. 09/946,228, filed Sep. 5, 2001, which is hereby incorporated herein by reference in its entirety). The transparent conductive coating or ITO coating 14 is disposed at a front surface of the plastic substrate 12 and provides a suitable resistivity across the surface. For example, the ITO coating resistivity range is preferably less than 1500 ohm/sq and greater than 100 ohm/sq, more preferably, the ITO coating resistivity may be about 600 ohm/sq or thereabouts, but may be as high as 1000 ohms or as low as 150 ohms. The coating process may be done during the manufacturing of the touch screen or the plastic substrate may be purchased in a "pre-coated" state without affecting the scope of the present invention.

The low temperature silver ink layer 22 provides an established electrode pattern, such as around the perimeter region of the substrate. The linearization pattern of the ink layer may be screen printed on the ITO coated material, such as in a manner known in the touch screen art. The material may comprise a thermally curable material (and may, for example, be cured via an infrared (IR) curing process), or may comprise a UV curable material. The curing process may utilize aspects of the processes described in U.S. provisional application Ser. No. 60/947,819, filed Jul. 3, 2007; and/or PCT Application No. PCT/US08/68987, filed Jul. 2, 2008, which are hereby incorporated herein by reference in their entireties. A laser may be used for isolation of traces inside the electrode pattern and for pattern trimming to increase accuracy.

The optical adhesive 18 is disposed between the ultra-thin glass substrate 16 and the plastic substrate 12 to adhere the ultra-thin glass substrate to the plastic substrate and is selected to have a refractive index that substantially matches or approximates the refractive index of the ultra-thin glass substrate 16. The adhesive process to be used may be similar to or utilize aspects of the processes described in U.S. patent application Ser. No. 10/603,518, filed Jun. 25, 2003, and published Jan. 8, 2004 as U.S. Patent Publication No. US 2004/0004605, which is hereby incorporated herein by reference in its entirety. Optionally, the optical adhesive may comprise an acrylic or urethane based material, and may be a UV curable adhesive. The optical adhesive may be chosen to provide enhanced bonding of materials of different thermal expansions characteristics (glass and plastic) such that the final construction could be used in a wide range of demanding applications—including, for example, automotive applications and the like.

The optical adhesive or medium or material or layer 18 may comprise an optically matching adhesive that may optically match the optical qualities of the ultra-thin glass substrate, such as by utilizing aspects of the assemblies described in U.S. patent application Ser. No. 10/993,302, filed Nov. 19, 2004, now U.S. Pat. No. 7,338,177, which is hereby incorporated herein by reference in its entirety. For example, the optical adhesive or medium or material may comprise an optical adhesive layer, such as an acrylic adhesive, a urethane adhesive, a silicone adhesive or epoxy adhesive or the like, with a refractive index (measured at the sodium D line) of preferably approximately 1.4 to approximately 1.6, more preferably approximately 1.45 to approximately 1.55, more preferably approximately 1.5 to approximately 1.54, such as approximately 1.52. The optical adhesive thus substantially matches the optical qualities or characteristics of the substrate material such as glass (which has a refractive index of approximately 1.52), and thus is not readily discernible by a person viewing the touch screen and looking through the ultra-thin substrate element. Such optical mediums or adhesives are known, such as the adhesive commercially available from Norland Products, Inc., New Brunswick, N.J., and such as described in U.S. Pat. Nos. 5,073,012; 5,115,346; 5,355, 245; and 5,523,877, which are hereby incorporated herein by reference.

Optionally, the touch screen 10 may include a darkened mask or black mask 26 (or other dark colored mask or masking layer or material), which may be directly printed on the inside of the AG coated ultra-thin glass substrate 16. The mask may be desired to hide or mask or conceal or substantially hide or render covert the silver pattern printed on the ITO coated plastic substrate 12. The mask may be UV cured—but could be IR cured at low temperature or otherwise cured, depending on the particular application of the touch screen and without affecting the scope of the present invention. Optionally, the mask may comprise a high temperature ceramic material if needed for increased dielectric constant.

The AG coated ultra-thin glass substrate 16 may have a thickness preferably between about 0.05 mm and about 0.2 mm, and preferably about 0.1 mm or thereabouts. The antiglare coating 20 may comprise a known or standard AG coating (such as described in one or more of the patents and applications incorporated by reference below) or by an ultrasonic coating (such as described in U.S. patent application Ser. No. 11/218,374, filed Sep. 2, 2005 by Cherif et al. for DISPLAY SUBSTRATE WITH DIFFUSER COATING, now U.S. Pat. No. 7,507,438, which is hereby incorporated herein by reference in its entirety). Additional coatings could be added to the AG top layer, such as, for example, an antifingerprinting coating, an anti-smudge coating or an anti-friction coating and/or the like.

The circuitry element or flexible printed circuit 24 may comprise a multi-wire cable assembly or flexible ribbon or the like. The flexible ribbon or cable includes multiple wires or traces that are connected to respective sets of screened on electrodes of the ink layer 22. The cable may be affixed to the glass using an anisotropic conductive film (ACF) adhesive (a single axis conductive adhesive activated with temperature and pressure) or other suitable adhesive or the like. The circuitry element may be electrically connected to circuitry of the device or other circuitry that may process signals communicated by the circuitry element to determine when the touch screen is touched and where on the screen the touching occurs.

Figure 2:
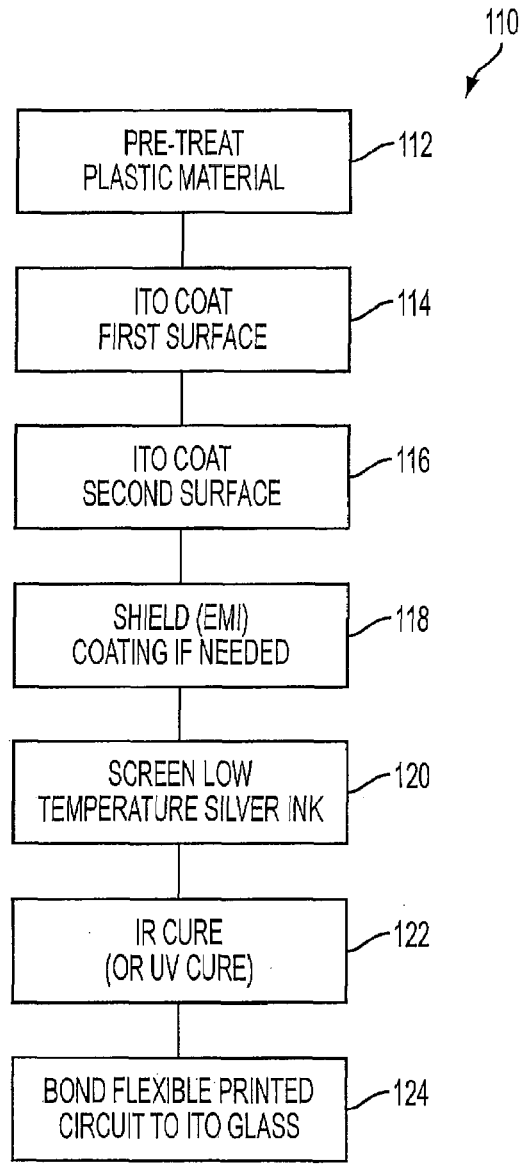
FIG. 2 is a process diagram of a method of producing a coated substrate for use in manufacturing a touch screen in accordance with the present invention.

The touch screen of the present invention may be manufactured or processed via any suitable process flow. For example, and as shown in FIG. 2, the process flow for manufacturing the coated plastic substrate may include a process 110 of producing an ITO coated substrate. The plastic substrate material may be pre-treated at 112 (such as via a plasma clean or ultrasonic wash process or the like). The first surface of the plastic substrate may be ITO coated at 114, and the second surface may be ITO coated at 116 and may be shield (EMI) coated at 118 if desired or appropriate or necessary, depending on the particular application of the touch screen. The low temperature silver ink may be screened onto the ITO coated plastic substrate at 120, and the substrate and coatings may be IR cured (or UV cured) at 122. The flexible printed circuit is then bonded to the ITO glass at 124, such as via an ACF adhesive or the like.

Figure 3:
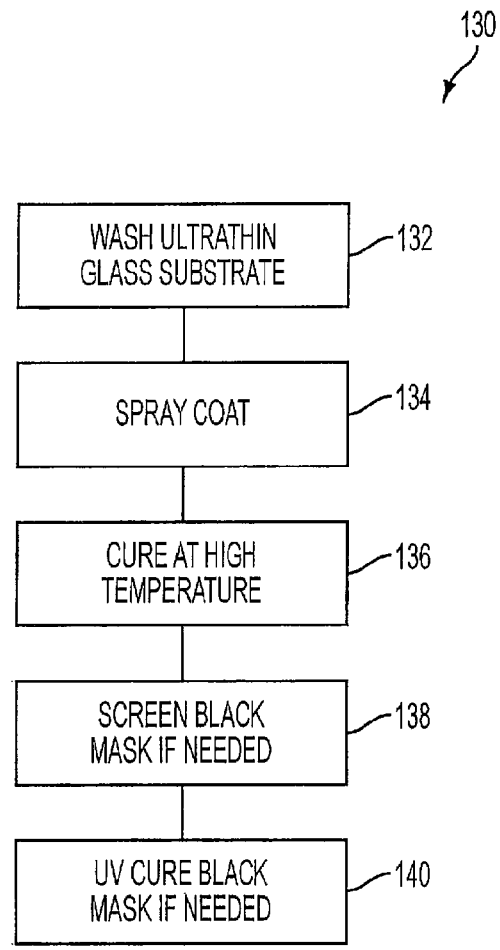
FIG. 3 is a process diagram of a method of producing a coated ultrathin glass substrate for use in manufacturing a touch screen in accordance with the present invention.

Optionally, to produce the AG coated top glass or ultra-thin glass substrate, a process 130 (FIG. 3) of producing the top glass may include washing the ultrathin glass substrate at 132 and spray coating the substrate with the AG coating at 134. The substrate and coating may be cured at 136 at a high temperature (or otherwise cured depending on the coating or coatings applied thereto, such as by utilizing aspects of the processes described in PCT Application No. PCT/US08/ 68987, filed Jul. 2, 2008, which is hereby incorporated herein by reference in its entirety). Optionally, the dark or black mask may be screened onto the rear or back surface of the ultrathin glass substrate at 138 if desired or appropriate or necessary. The black or dark mask may then be cured at 140, such as by UV curing or the like.

Figure 4:
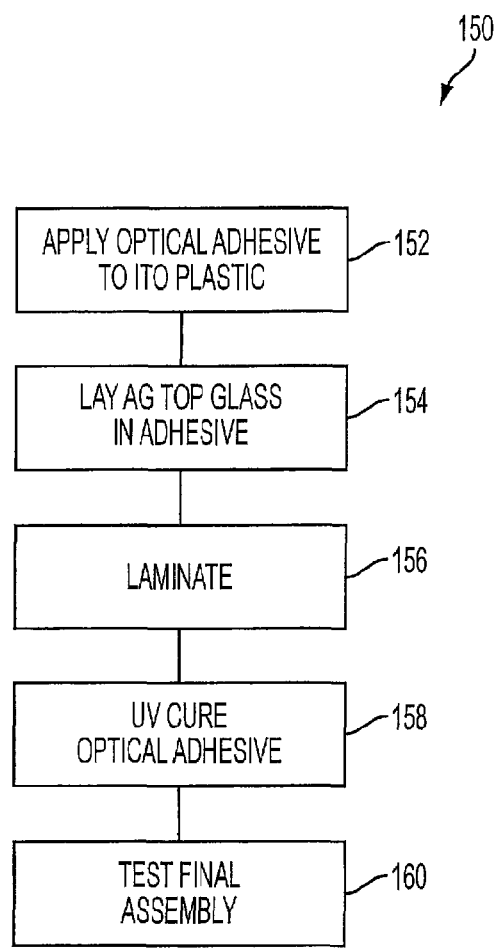
FIG. 4 is a process diagram of a method of laminating the coated substrate and coated ultrathin glass substrate together during the manufacturing of a touch screen in accordance with the present invention.

The touch screen may then be assembled or laminated together via a laminating process 150 (FIG. 4) by applying an optical adhesive to the ITO coated plastic substrate at 152 and laying the AG coated top glass in the adhesive at 154 and laminating the elements together at 156. The optical adhesive is cured at 158 (such as via a UV curing process or the like) and the final assembly may be tested at 160.

The touch screen of the present invention may be suitable for use over a variety of applications, such as, for example, GPS applications, handheld gaming system applications, tablet PC applications, ATM applications, slot machine applications, cell phone applications and/or the like. The touch screen of the present invention provides an enhanced hardcoat at its outer surface (there is typically no better hardcoat than solid glass, which does not have the concerns of wearing off the ITO coating over time). The touch screen or sensor of the present invention provides enhanced optical properties than standard ATO constructions in the market today. The touch screen or sensor of the present invention is highly durable, and would have reduced breakage problems in the field—and could be used in vandal-proof applications or the like. The touch screen or sensor of the present invention provides a reduced weight via the plastic substrate construction as compared to glass substrate constructions. The black mask of the touch screen of the present invention also allows for a flush-mounted touch screen or sensor in its final assembly or application.

The process and/or finished touch screen product of the present invention may utilize aspects of the processes and/or products described in U.S. Pat. Nos. 4,490,227; 4,650,557; 4,655,811; 5,725,957; 6,001,486; 6,087,012; 6,440,491; 6,620,454; 6,627,918; 6,706,552; 6,787,240; and/or 7,165, 323; and/or U.S. patent applications, Ser. No. 09/946,228, filed Sep. 5, 2001 by Ippel et al. for PLASTIC SUBSTRATE FOR INFORMATION DEVICE AND METHOD FOR MAKING SAME; Ser. No. 09/974,209, filed Oct. 10, 2001; Ser. No. 10/744,522, filed Dec. 23, 2003 by Halsey et al. for METHOD FOR MAKING AN INTERACTIVE INFORMATION DEVICE; Ser. No. 10/798,171, filed Mar. 11, 2004 by Getz for LASER DELETION FOR TOUCH SCREEN; Ser. No. 11/218,374, filed Sep. 2, 2005 by Cherif et al. for DISPLAY SUBSTRATE WITH DIFFUSER COATING, now U.S. Pat. No. 7,507,438; and/or Ser. No. 11/440,855, filed May 25, 2006, and/or U.S. provisional application, Ser. No. 60/947,819, filed Jul. 3, 2007, and/or PCT Application No. PCT/US08/68987, filed Jul. 2, 2008, which are all hereby incorporated herein by reference in their entireties.

Optionally, the present invention may provide a surface capacitive sensor device that provides enhanced manufacturing and enhanced performance and that is highly suitable for use in "flush-mounted" applications, where the sensor may be mounted at an LCD or other display with its outer surface generally flush with the outer surface of the display and with minimal (and preferably with no) bezel or perimeter frame around the sensor and over the perimeter region of the outer surface of the sensor. The surface capacitive sensor can be manufactured in any suitable fashion (such as by utilizing conventional techniques or by utilizing aspects of the sensors and manufacturing processes described in U.S. Pat. Nos. 6,488,981; 6,549,193; 6,727,895; and/or 6,842,171; and/or U.S. provisional applications, Ser. No. 60/947,819, filed Jul. 3, 2007; and/or Ser. No. 60/952,428, filed Jul. 27, 2007; and/or PCT Application No. PCT/US08/68987, filed Jul. 2, 2008, which are all hereby incorporated herein by reference in their entireties), such as by using printed UV or IR curable dielectric or insulating tape over the edge electrode pattern to avoid contact with said electrode pattern. In addition, the connection joint for either the soldered flexible cable or anisotropic conductive film (ACF) attachment of the printed circuit is left exposed and secondarily covered with another material, such as tape or the like. In these constructions, the edge electrode and cable attachment may desirably be hidden under the bezel of the LCD or other display.

Figure 5:
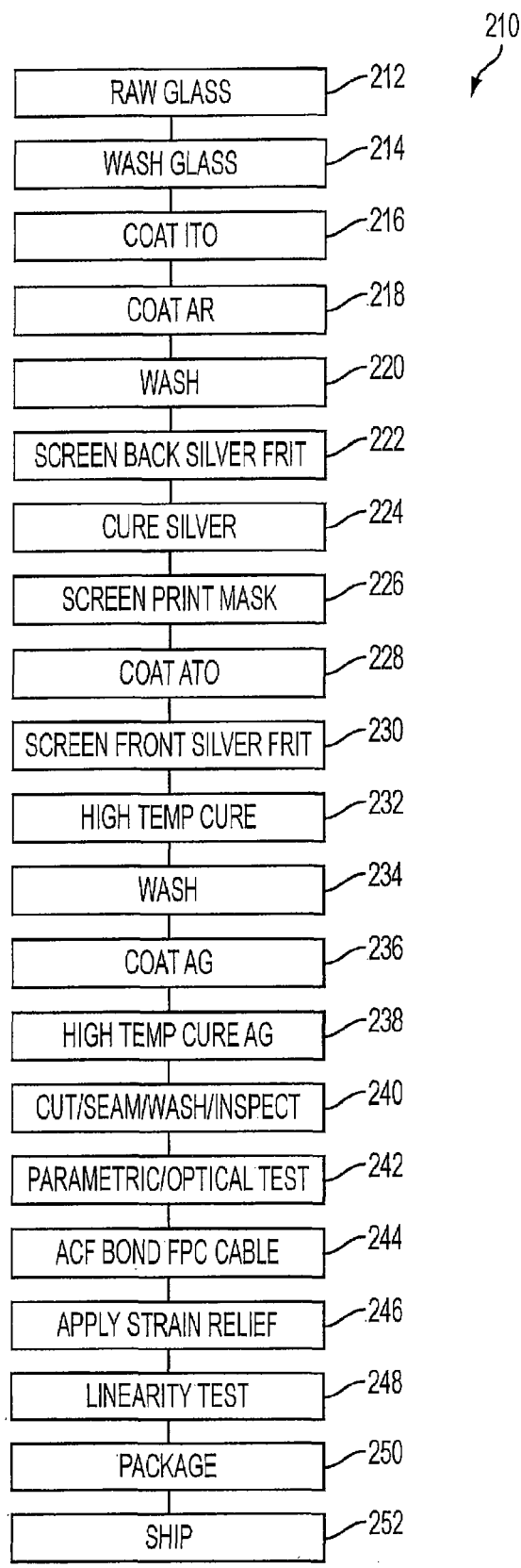
FIG. 5 is a process flow diagram of a process of forming a capacitive sensor.
Figure 6:
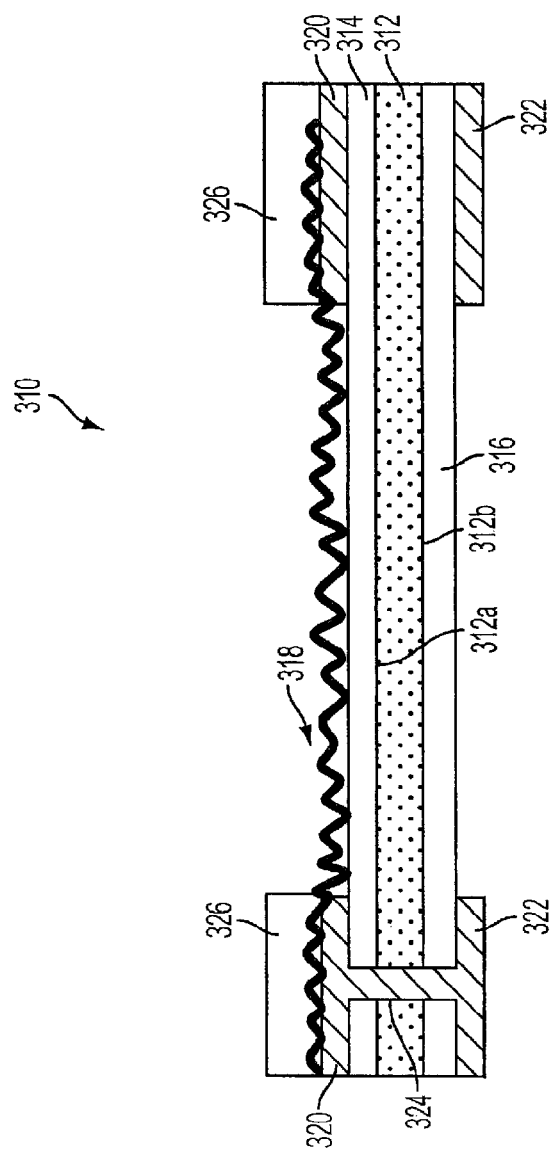
FIG. 6 is a sectional view of a capacitive sensor in accordance with the present invention.

An exemplary process 210 for forming such a touch sensor is set forth in FIG. 5. For example, raw glass may be provided at 212 and washed at 214. The glass is coated with a transparent conductor (such as ITO) at 216 and coated with an AR coating at 218 and then washed at 220. A silver frit layer or pattern of electrodes is disposed or screened onto the rear surface of the substrate at 222 and cured at 224. A mask is screen printed onto the substrate at 226 and an ATO coating is applied at 228. A silver frit layer or pattern of electrodes is disposed or screened onto the front surface of the substrate at 230 and cured (such as by a high temperature curing process) at 232. The substrate is washed at 234 and coated with an AG coating at 236 and cured (such as by a high temperature curing process) at 238. The coated substrate is then cut, seamed, washed and inspected at 240 and tested at 242. The flexible cable is ACF bonded at 244 and a strain relief is applied at 246 and the product is tested at 248. The completed product is packaged at 250 and shipped or transported at 252.

Typically, a sensor has the electrical connection to the four signal terminations made at the front side of the substrate, such as generally at the front surface of the corner regions of the substrate, and thus is not a flush-mountable sensor due to the presence of the electrical connections at the front surface of the substrate. An aspect of the present invention is to redesign the sensor allowing it to be "flush-mounted" to the LCD and corresponding assembly. With such a sensor, the edge electrode and cable attachment do not need to be hidden under the bezel. Such constructions can be referred to as "flush-mounted" or "bezel-free" or "frameless". In such flush-mount constructions, the cable or electrical connection is moved to the backside of the sensor—since either the solder connection or the ACF connection can be done on the first surface (touch surface) of the glass without deleteriously impacting functional aesthetics. It is desirable that such a construction meet the following criteria:

1. an opaque border hides circuitry at the edge of the sensor (such an opaque or black out perimeter coating may be disposed at the first or front surface or optionally at the second or rear surface of the substrate);
2. there is little or no added height from the interconnect between the sensor and the cables;
3. there is no false activation from contacting the opaque border; and
4. the opaque border meets the same standard for durability as the sensor.

To manufacture the sensor so that there is little or no added height resulting from the interconnect between the sensor and the cables (see requirement No. 2 above), there are three options discussed herein:

1. Paint the four signal terminations (such as at the corners of the substrate or otherwise if traces are used) of the sensor with conductive material that allows the signal to be transferred from the front surface to the rear of the glass (such as by wrapping the conductive material around the cut edge of the substrate to establish conductive continuity between the front surface of the glass substrate to the rear surface of the glass substrate).
2. Attach a secondary clip or connector to the four signal terminations (such as at the corners of the substrate or otherwise if traces are used).
3. Fabricate (such as by drilling or otherwise forming or establishing) passageways or vias through the glass substrate to allow connection between the four signal terminations and the rear of the glass.

The passageway or via (i.e. a hole or aperture formed or established through the substrate) formation of option No. 3 may provide the following benefits:

1. a lower profile over option No. 2 since the clips of option No. 2 add height to the substrate at the first surface and may not meet the true requirements of the "flush-mount" construction.
2. The paint option of option No. 1 may be hard to control the following: (a) the height of paint may cause visual disruption on the front or first surface or may require extra planarization to match the silver pattern; (b) the durability of the material may be suspect as low temperature materials are most commonly used; (c) there may be incompatibility concerns with the low temperature material and the opaque durable border processing; (d) the interconnect between the sensor and flex circuit may be compromised with the low temperature materials necessary for the paint option; (e) the impedance of signal channels is controlled by the conductivity of silver and paint materials and may be difficult to control to the level necessary for a capacitive sensor to properly function if a paint is used; and (f) the silver on the edge may be visible unless an opaque border is printed on the edge of the glass.

The via option (see option No. 3 above) may be a preferred production concept because of the following:

1. Termination of vias at a single connection point on one side of the glass versus vias on each corner of the glass that would need to be routed back to a single connection point (using silver and isolation lines) on the back side of the glass. By terminating in one location instead of on the corners, the vias can be located in the middle of one of the sides of the sensor and moved away from the perimeter or edge regions of the glass substrate. This reduces or minimizes the potential for glass substrate breakage that may come with the drilled vias.
2. Isolation of the shield layer (when present—backside of the glass) from the vias post or pre deposition of the shield layer. Post isolation using laser deletion of the shield layer or pre-isolation using shadow mask or physical mask in coater at time of deposition.
3. The ability to use either a solder attachment to a flex laminated cable or an ACF to a flexible printed circuit to the flex cable.
4. Consistent resistance of conductive material through the vias does not significantly change impedance of any of the four signal carrying channels of the capacitive sensor and thus does not significantly alter or adversely effect the performance of the sensor.

5. The via construction allows for the opaque dielectric border to be printed in the mother glass state (large uncut glass substrate) versus the cut-to-size state that would be required with a painted application.

Another advantage of the process of the present invention for the flush mount constructions includes the benefits achieved by moving the connections away from the corners. For example, by moving the connections away from the corners, it may be easier to manufacture a surface capacitive sensor with shaped corners (radius and otherwise) that would be difficult to manufacture if the connection would have to be made in this region.

Referring now to FIGS. 6-9, a surface capacitive sensor 310 in accordance with the present invention is shown. In the illustrated embodiment, sensor 310 includes a rigid or flexible substrate 312 (such as a soda-lime glass substrate or a plastic or polymeric substrate or the like) with a transparent conductive layer 314 (such as a coating or layer of antimony tin oxide (ATO) or indium tin oxide (ITO) or the like) disposed on a front surface 312a thereof and a shield coating 316 (such as an indium tin oxide (ITO) shield or coating or the like or similar transparent conductor coating or a similar EMI reducing coating or the like) disposed on a rear surface 312b thereof. The front or outer surface 312a of the glass substrate 312 is coated with a protective overcoat 318. A conductive coating or pad 320 (such as a silver material or silver paste or the like) may be disposed at the front surface of the substrate 312 and a conductive coating or pad 322 (such as a silver material or silver paste or the like) may be disposed at the rear surface of the substrate 312 and generally corresponding to the locations of the conductive coating or pads 320 at the front substrate. The sensor includes a plurality of pads 320, 322, which are patterned (such as at spaced apart locations around the perimeter regions of the substrate or along a selected perimeter edge region or the like) are provided for electrical connection of the four signal terminations of the sensor.

One or more holes or passageways or vias 324 may be established through the substrate 312 (such as by drilling through the substrate at the desired or appropriate locations). The holes or vias are established at the regions where the pads 320, 322 are to be deposited or established, such that, during the establishing of the pads (such as by screening on or otherwise coating or establishing the conductive coating or paste at the substrate), a portion of the front conductive coating or pad 320 may flow into the respective via 324, while a portion of the rear conductive coating or pad 322 may flow into the respective via 324, whereby the conductive portions may meet or contact one another or electrically connect with one another within the via to establish electrical continuity through the substrate by the filled or partially filled vias 324.

Optionally, a dark masking layer 326 (such as an opaque dielectric material or black mask or paint or ceramic frit or coating or the like) may be disposed at the front of the substrate 312, such as at or around a perimeter region of the substrate (and generally corresponding to regions where the conductive pads are disposed). Although not shown, the front surface of the substrate may include isolation or deletion lines through the conductive coating to establish conductive continuity from the via locations to or toward the respective corner regions of the substrate so that the signals communicated through the vias are indicative of the signals at the respective corner regions of the substrate.

Figure 9:
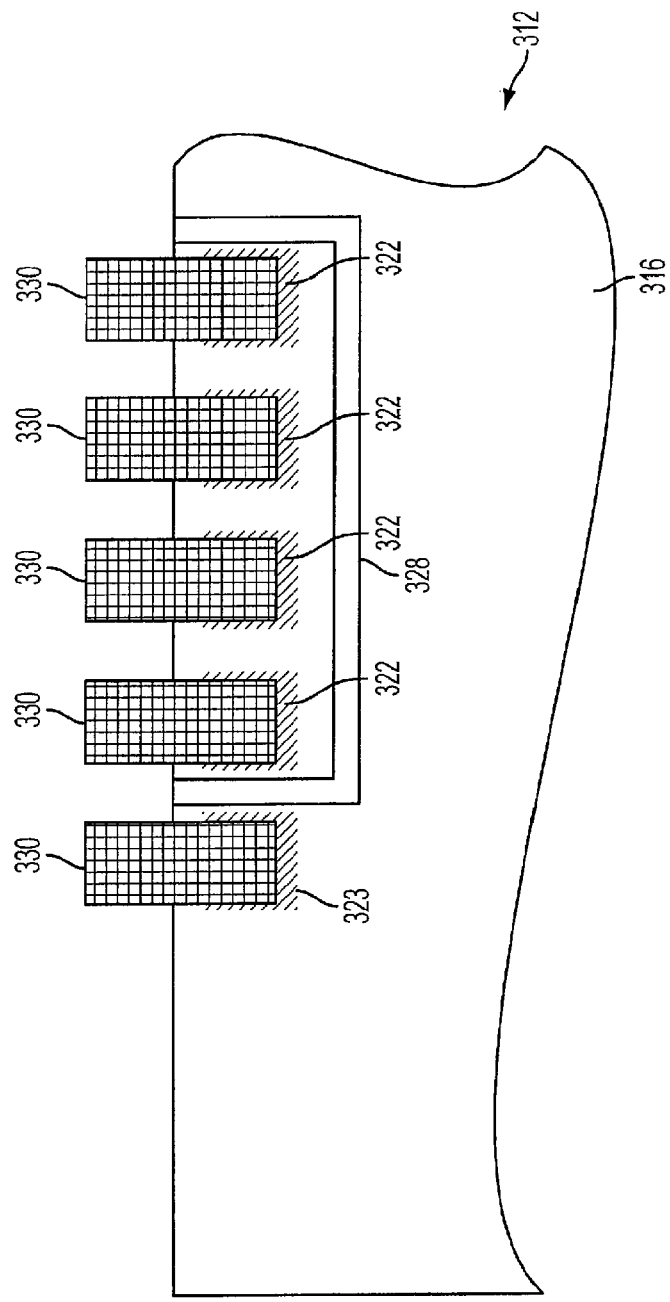
FIG. 9 is a rear view of the capacitive sensor of FIGS. 7 and 8, showing the cable leads at the vias.

As shown in FIGS. 7-9, the vias 324 may be spaced apart at or near a perimeter edge or edge region of the substrate and a deletion area 328 may be established through the conductive coating 314 to electrically isolate the vias 324. In the illustrated embodiment, there are four pads 322 with associated vias 324 to connect to the pads 320 at the front of the substrate so as to establish conductive continuity through the substrate and between the pads 320 and 322 by the vias 324. As shown in FIGS. 8 and 9, a fifth pad 323 may be formed at the rear surface of the substrate (and without an associated passageway or via through the substrate) for electrical connection to the rear shield layer or shield coating 316. As shown in FIG. 9, electrical cables or leads or connectors 330 may be electrically connected to the pads 322, 323 at the rear of the substrate 312 to electrically connect the sensor 310 to a power source or control or control circuitry, whereby the signals are communicated to circuitry that may determine the location of a surface contact to the sensor relative to the front corner regions or terminals or the like.

Figure 10A:
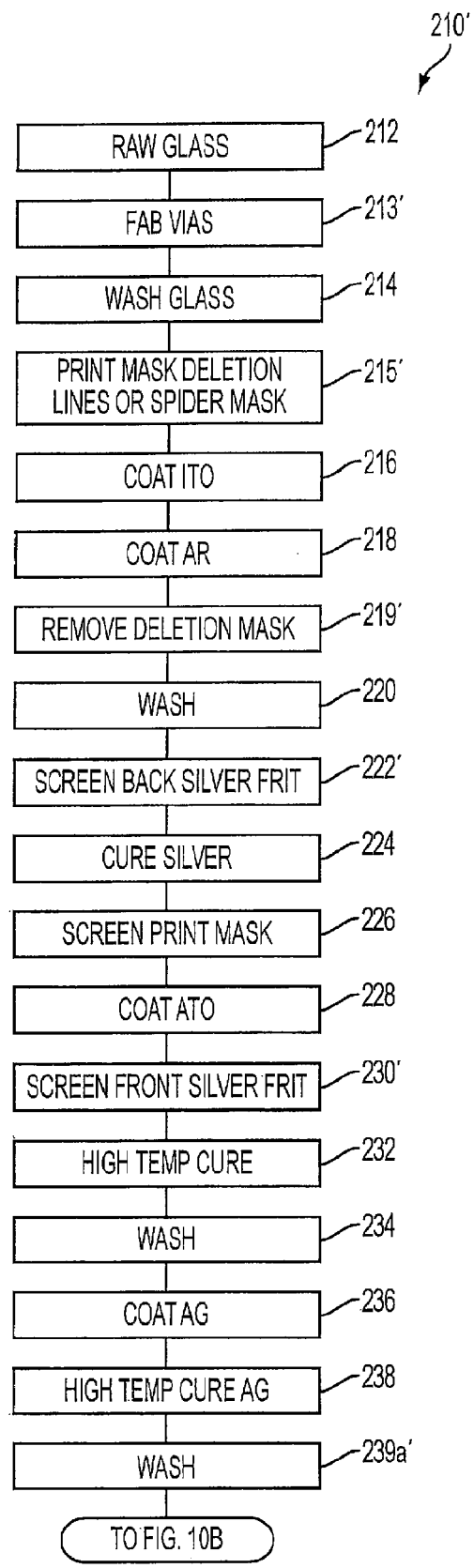
FIGS. 10A and 10B depict a process flow diagram of a flush mount capacitive sensor forming process having vias formed through the substrate in accordance with the present invention.
Figure 10B:
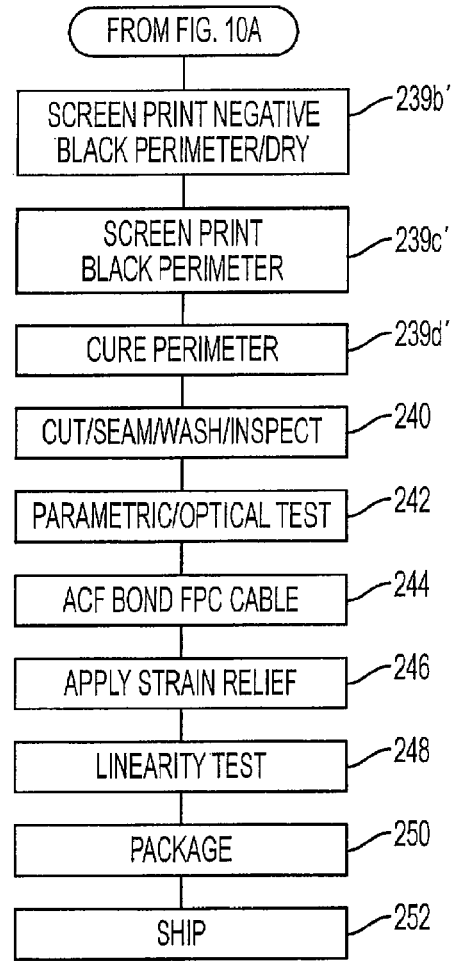

An exemplary process for forming the sensor 310 is set forth in FIGS. 10A and 10B. As can be seen in FIGS. 10A and 10B, a flush mount process flow 210' is generally similar to process flow 210, discussed above, and includes the step of fabricating or establishing or forming the vias at 213' in or through the raw glass and printing mask deletion lines or a spider mask on the substrate at 215' and removing the mask at 219' (if the mask is printed; if a spider mask is used, this step may be obviated) after the substrate has been coated with the ITO coating at 216 and coated with the AR coating at 218, When the back silver frit is applied at 222' and when the front silver frit is applied at 230', the silver frit flows into the vias (such as by part of the back silver frit partially flowing into the vias and the front silver frit filling or substantially filling the remaining or as of yet unfilled portions of the vias) and establishes conductive continuity through the substrate. After the AG coating is applied at 236 and cured at 238, the coated substrate is washed at 239a' and then a negative black perimeter is screen printed onto the substrate and dried at 239b' and a black perimeter is screen printed onto the substrate at 239c' and cured at 239d'. The product is then formed and tested and finished and packaged and shipped at 240-252, such as in a similar manner as described above. The other steps of process flow 210' may be substantially similar to the corresponding steps of process flow 210, discussed above, and are referred to in FIGS. 10A and 10B with reference numbers similar to those of FIG. 5, such that a detailed discussion of the process flows need not be repeated herein.

Another step in manufacturing the flush-mount surface capacitive sensor of the present invention is the application of an opaque dielectric border over the electrode pattern. Such a border should meet some or all of these criteria:

1. The dielectric strength should be such that any touch on the border does not activate a positional touch on the sensor.
2. The durability should be such that the material cannot be removed by normal scratching of a finger, stylus or other everyday usage material.
3. The opacity should be such that any printed material cannot be seen through the border.
4. The thickness should be such that the tactile step height is minimized as much as possible.
5. The surface finish should desirably be either a matte or glossy appearance.

It is desirable to develop a process that meets the above requirements in both matte and glossy finish applications. To do so the following process steps are useful:

1. Black material selected is a high temperature ceramic frit vis-a-vis a UV or IR cured dielectric material. By selecting the ceramic material, the dielectric constant is high and durability is enhanced.
2. In order to meet the opacity requirements, a negative image of the underlying silver pattern preferably is printed or otherwise applied with either the same dielectric material or a comparable insulating material before the final complete border is printed. This is an important step in keeping the total thickness low and thus the tactile height minimal.
3. The opaque border is printed past what will be the cut edge of the sensor such that when cut, the black border is at the edge of the glass.

Figure 11:
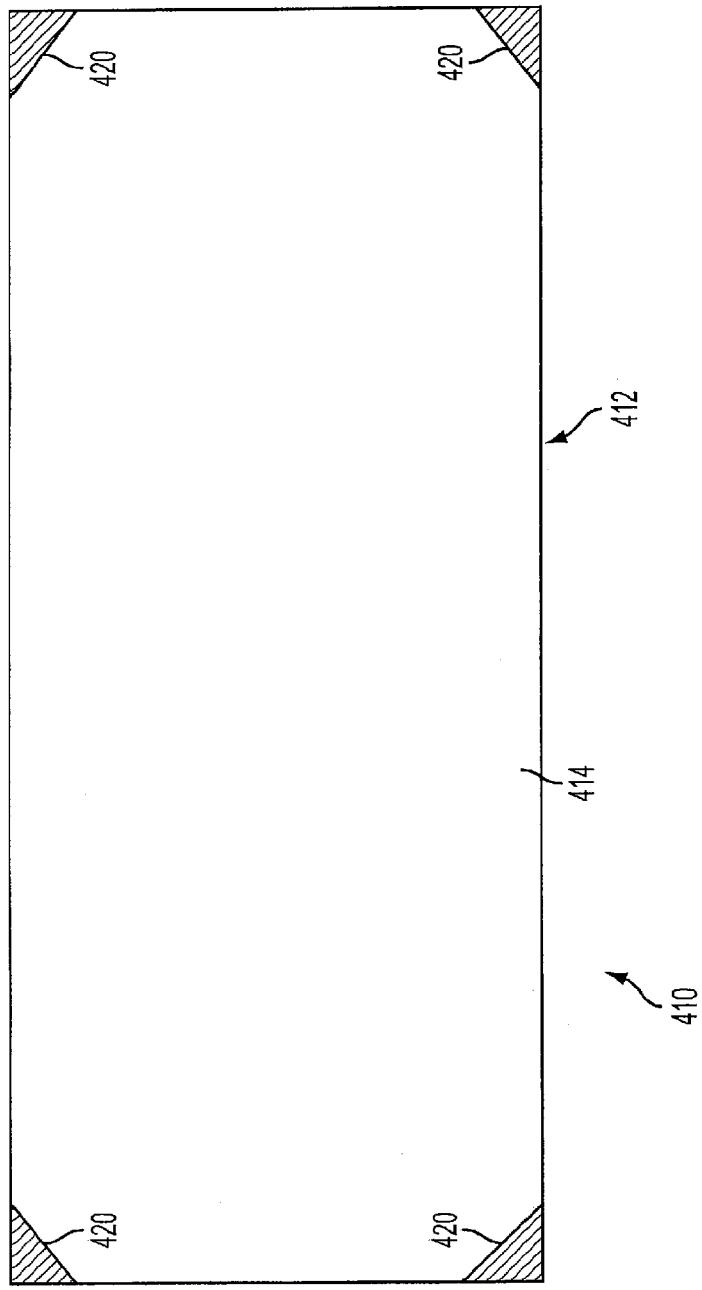
FIG. 11 is a front view of a capacitive sensor of the present invention, showing the dipped silver corners.
Figure 12:
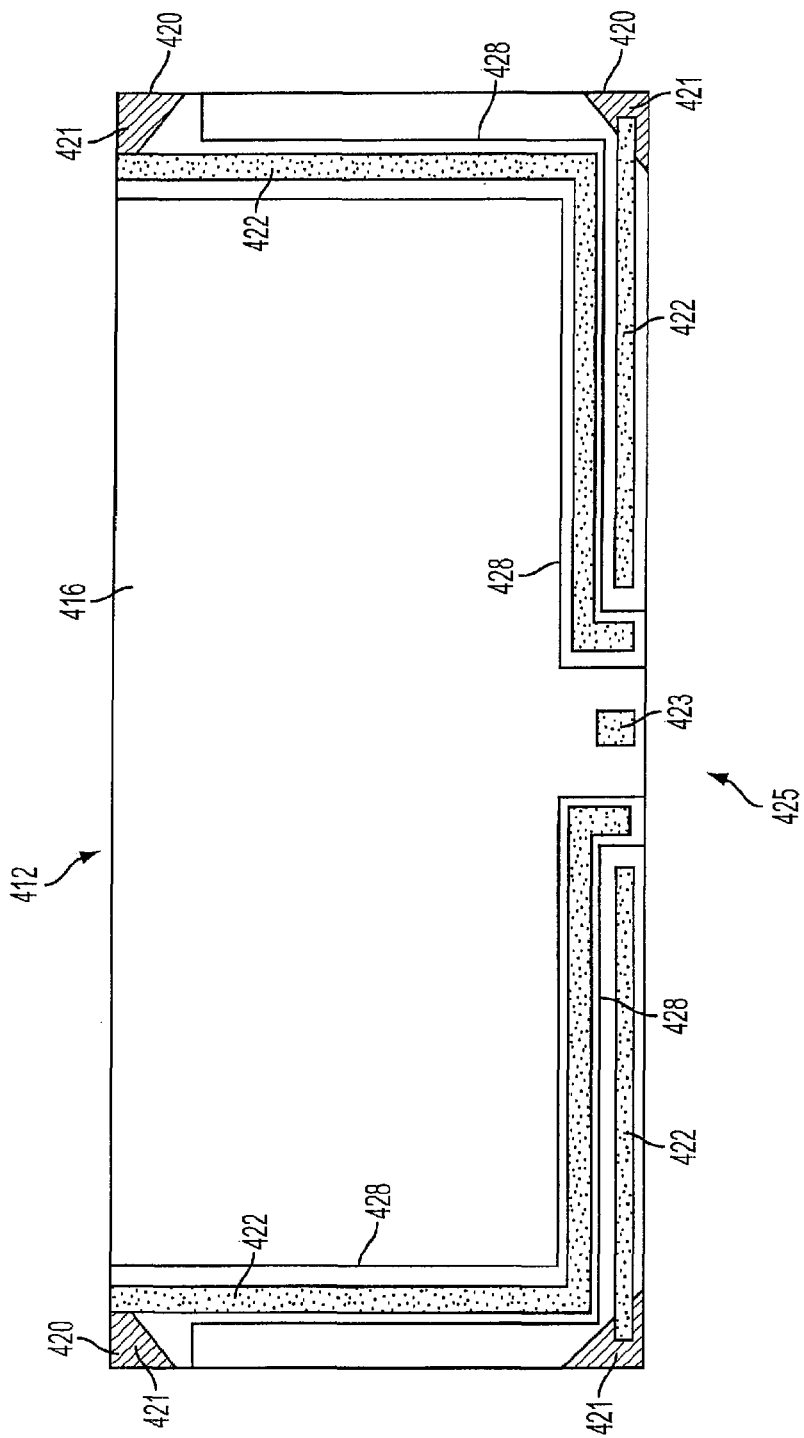
FIG. 12 is a rear view of the capacitive sensor of FIG. 11, showing the conductive traces connecting to the dipped corners and the deletion areas to electrically isolate the conductive traces.
Figure 13:
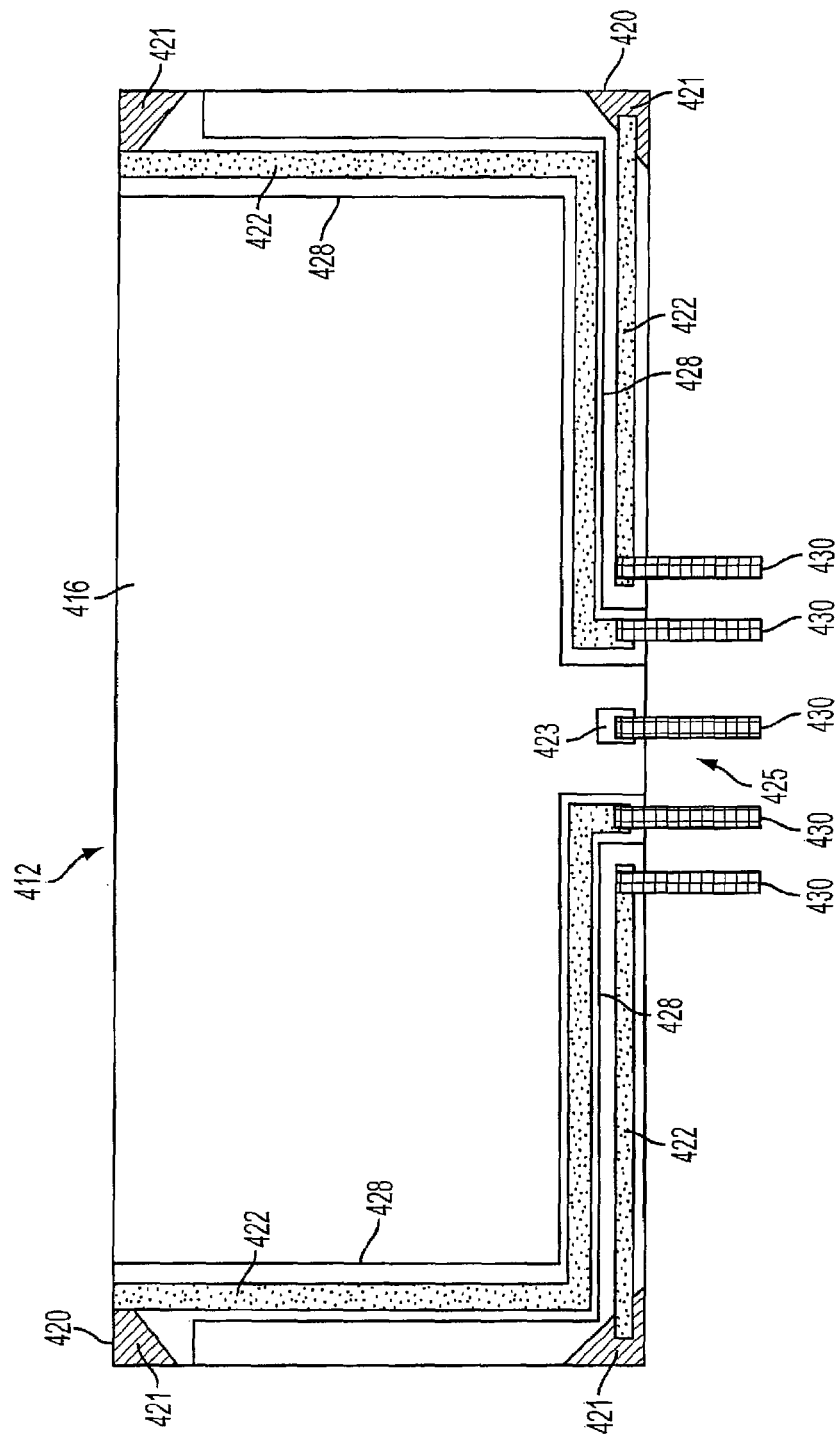
FIG. 13 is a rear view of the capacitive sensor of FIGS. 11 and 12, showing cable leads at the conductive traces.

Optionally, the four signal terminations may be electrically connected to the power or control by perimeter or corner conductive pads or portions. For example, and with reference to FIGS. 11-13, a surface capacitive sensor 410 includes a substrate 412 (such as a soda-lime glass substrate or a plastic or polymeric substrate or the like) with a transparent conductive layer 414 (such as a coating or layer of antimony tin oxide (ATO) or indium tin oxide (ITO) or the like) disposed on a front surface thereof (as can be seen in FIG. 11) and a shield coating 416 (such as an indium tin oxide (ITO) coating or the like or similar transparent conductor coating or a similar EMI reducing coating or the like) disposed on a rear surface thereof (as can be seen in FIGS. 12 and 13). The front or outer surface of the glass substrate 412 may be coated with a protective overcoat. As can be seen with reference to FIGS. 11-13, each corner of the substrate 412 may be coated by or dipped into a conductive material (such as a silver material or silver paste or the like) to establish conductive corners 420 having the conductive material disposed at each of the front and rear surfaces and having the conductive material wrap around the edge dimensions at the corners to establish conductive continuity between the front corner regions and the respective rear corner regions. Optionally, the conductive material may be screen printed or booby printed or pad printed at the front surface of the substrate and may wrap around the cut edge of the substrate to provide or establish conductive continuity between the front and rear surfaces at the coated corner regions of the substrate.

As shown in FIGS. 12 and 13, the rear conductive portions 421 of the conductive corners may be electrically connected to a connecting region 425 (such as a perimeter edge region) of the sensor by respective traces 422 (such as silver traces) electrically connected to the rear portions 421 of the conductive corners 420 and established along the rear surface of the substrate to the connecting region. A deletion line or area 428 may be established (such as by masking during the conductive coating process or by laser deletion of the conductive coating) at the rear surface of the substrate to electrically isolate the conductive traces. In the illustrated embodiment, there are four conductive corners with conductive traces associated therewith. As shown in FIGS. 12 and 13, a pad 423 may be formed at the rear surface of the substrate for electrical connection to the rear shield layer or shield coating 416. As shown in FIG. 13, electrical cables or leads 430 may be electrically connected to the pads conductive traces 421 and pad 423 at the rear of the substrate 412 to electrically connect the sensor 410 to a power source or control or circuitry, whereby the signals are communicated to circuitry that may determine the location of a surface contact to the sensor relative to the front corner regions or terminals or the like.

Figure 14A:
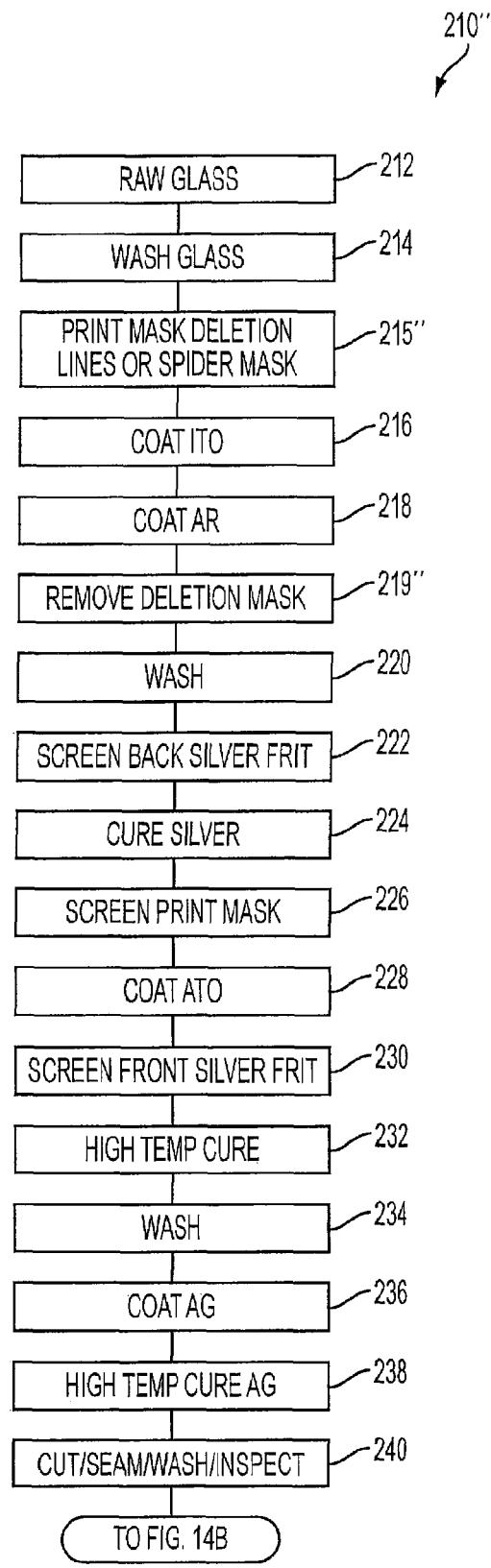
FIGS. 14A and 14B depict a process flow diagram of a flush mount capacitive sensor and dip process in accordance with the present invention.
Figure 14B:
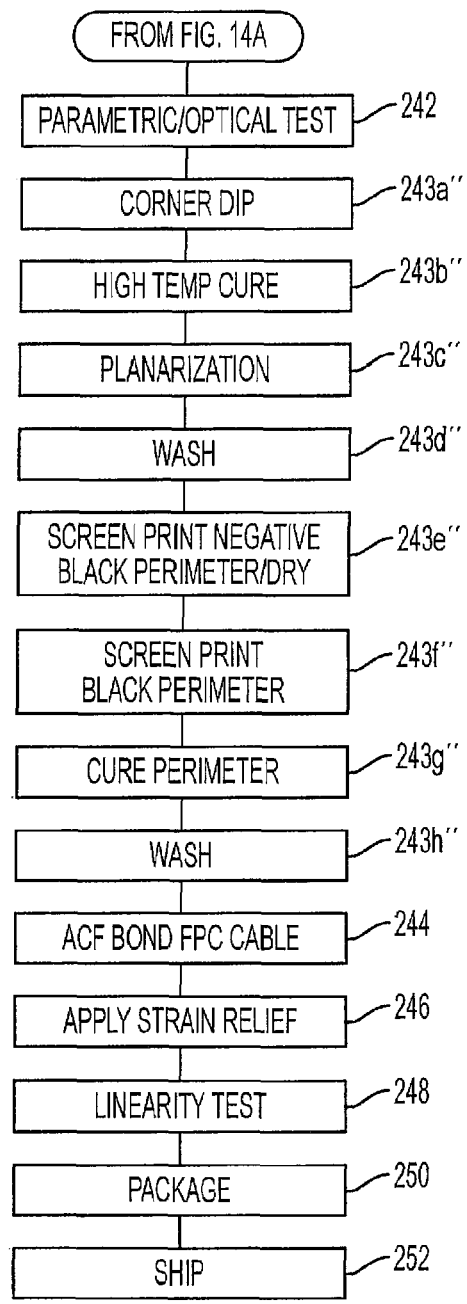

An exemplary process for forming the sensor 410 is set forth in FIGS. 14A and 14B. As can be seen in FIGS. 14A and 14B, a flush mount process flow 210" is generally similar to process flow 210', discussed above (except with out the step 213' of fabricating vias), and includes the step of printing mask deletion lines or a spider mask on the substrate at 215" and removing the mask at 219" (if the mask is printed; if a spider mask is used, this step may be obviated) after the substrate has been coated with the ITO coating at 216 and coated with the AR coating at 218. After the coated substrate is cut, seamed, washed and inspected at 240 and tested at 242, the corners of the substrate are dipped at 243a" and cured (such as by a high temperature cure) at 243b". The coated substrate is planarized at 243c". Then, and similar to steps 239a'-239d', discussed above, the coated substrate is washed at 243d" and a negative black perimeter is screen printed onto the substrate and dried at 243e" and a black perimeter is screen printed onto the substrate at 243f" and cured at 243g" and washed at 243h". The cable is then bonded and the product is tested and packaged and shipped at 244-252, such as in a similar manner as described above. The other steps of process flow 210" may be substantially similar to the corresponding steps of process flow 210, 210', discussed above, and are referred to in FIGS. 14A and 14B with reference numbers similar to those of FIG. 5, such that a detailed discussion of the process flows need not be repeated herein.

The corners may be coated with an electrically conductive layer or coating by any suitable coating process, such as by sputter deposition or other deposition techniques that coat the corner regions and that wrap around the edges of the substrate at the corner regions to establish conductive continuity between the coated front corner region and the coated rear corner region. Optionally, the coating process may utilize aspects of the coating processes and coated substrates and techniques and processes described in U.S. Pat. Nos. 7,274,501; 7,184,190; and/or 7,255,451, which are hereby incorporated herein by reference in their entireties. Optionally, the substrate may be coated in a chamber that may coat the corners or regions of the front and rear surfaces at the same time and/or with the same deposition process. Although shown and described as providing dipped or otherwise wraparound coated corners, it is envisioned that the sensor of the present invention may coat other perimeter regions of the substrate with a wraparound type coating, whereby the front and rear perimeter regions are coated with a conductive coating and the associated perimeter edge of the substrate is also coated with a conductive coating to establish conductive continuity between the respective front and rear perimeter regions.

Optionally, the sensor or sensors may include a darkened mask or black mask (or other dark colored mask or masking layer or material), which may be directly printed on the outer surface or inner surface of the coated glass substrate. The mask may be desired to hide or mask or conceal or substantially hide or camouflage or render covert the silver pattern printed on the coated substrate. The mask may be UV cured—but could be IR cured at low temperature, depending on the particular application of the sensor and without affecting the scope of the present invention. Optionally, the mask may comprise a high temperature ceramic material if needed for increased dielectric constant.

The process and/or finished product of the present invention may utilize aspects of the processes and/or products described in U.S. Pat. Nos. 4,490,227; 4,650,557; 4,655,811; 5,725,957; 6,001,486; 6,087,012; 6,440,491; 6,620,454; 6,627,918; 6,706,552; 6,787,240; and/or 7,165,323; and/or U.S. patent applications, Ser. No. 09/946,228, filed Sep. 5, 2001 by Ippel et al. for PLASTIC SUBSTRATE FOR INFORMATION DEVICE AND METHOD FOR MAKING SAME; Ser. No. 09/974,209, filed Oct. 10, 2001; Ser. No.

10/744,522, filed Dec. 23, 2003 by Halsey et al. for METHOD FOR MAKING AN INTERACTIVE INFORMATION DEVICE; Ser. No. 10/798,171, filed Mar. 11, 2004 by Getz for LASER DELETION FOR TOUCH SCREEN; Ser. No. 11/218,374, filed Sep. 2, 2005 by Cherif et al. for DISPLAY SUBSTRATE WITH DIFFUSER COATING, now U.S. Pat. No. 7,507,438; and/or Ser. No. 11/440,855, filed May 25, 2006, and/or U.S. provisional applications, Ser. No. 60/947,819, filed Jul. 3, 2007; and/or Ser. No. 60/952,428, filed Jul. 27, 2007; and/or PCT Application No. PCT/US08/68987, filed Jul. 2, 2008, which are all hereby incorporated herein by reference in their entireties.

Changes and modifications in the specifically described embodiments may be carried out without departing from the principles of the present invention, which is intended to be limited only by the scope of the appended claims as interpreted according to the principles of patent law.

The invention claimed is:

1. A touch sensor comprising:
    a substrate having a first surface and a second surface, said substrate having at least one passageway established through said substrate;
    a first conductive coating established at said first surface of said substrate; and
    a conductive element disposed at said substrate and at least partially through said at least one passageway;
    a second conductive coating established at said second surface of said substrate, at least one first rear pad formed on said second conductive coating and at least one second rear pad formed on said second conductive coating, and a deletion area formed through said second conductive coating, wherein said conductive element establishing conductive continuity between said first conductive coating and said at least one first rear pad, said at least one second rear pad is electrically isolated from said at least one first rear pad by said deletion area.

2. The touch sensor of claim 1, wherein said touch sensor comprises a capacitive touch sensor.

3. The touch sensor of claim 1, wherein said conductive element comprises a metallic material that is disposed at least partially over said first surface proximate said at least one passageway.

4. The touch sensor of claim 3, wherein said conductive element is disposed at least partially over said second surface proximate said at least one passageway.

5. The touch sensor of claim 1, wherein said at least one passageway comprises at least two passageways, each with a respective conductive element established therethrough, said conductive elements at said passageways being electrically isolated from one another.

6. The touch sensor of claim 5 further comprising at least two conductive connectors, each of said at least two conductive connectors being conductively connected to a portion of a respective one of said conductive elements at said second surface of said substrate.

7. The touch sensor of claim 5, wherein said at least two passageways comprises four passageways.

8. The touch sensor of claim 1, wherein said at least one passageway is established inboard of a perimeter edge of said substrate.

9. The touch sensor of claim 1, wherein said conductive element comprises a first conductive material of at least one top conductive pad disposed at said first conductive coating on said first surface and partially into said at least one passageway and a second conductive material of said at least one first rear pad disposed at said second conductive coating on said second surface and partially into said at least one passageway, said first and second conductive materials contacting one another in said at least one passageway to establish conductive continuity between said at least one top conductive pad and said at least one first rear pad at said first and second surfaces of said substrate.

10. The touch sensor of claim 1, wherein said substrate comprises one of a glass substrate and a plastic substrate.

11. The touch sensor of claim 1, wherein said substrate comprises a flexible plastic substrate, and wherein said conductive coating comprises a transparent conductive coating.

12. The touch sensor of claim 1, wherein said touch sensor comprises a plastic capacitive touch sensor, said plastic capacitive touch sensor comprising an ultra-thin substrate disposed at said first surface of said substrate and an optical adhesive disposed and sandwiched between said substrate and said ultra-thin substrate to adhere said ultra-thin substrate to said substrate.

13. The touch sensor of claim 1, wherein said first and second conductive coatings respectively comprises a transparent conductive coating.

14. A method of manufacturing a touch sensor, said method comprising:
    providing a substrate having a first surface and a second surface;
    establishing a first conductive coating at said first surface of said substrate and establishing a second conductive coating at said second surface of said substrate, wherein at least one first rear pad is formed on said second conductive coating and at least one second rear Dad is formed on said second conductive coating, and a deletion area is formed through said second conductive coating;
    establishing at least one passageway through said substrate;
    providing a conductive element at said substrate and at least partially through said at least one passageway, said conductive element establishing conductive continuity between said first conductive coating and said at least one first rear pad, said at least one second rear pad being electrically isolated from said at least one first rear pad by said deletion area.

15. The method of claim 14, wherein providing a conductive element comprises:
    establishing at least one top conductive pad at said first conductive coating on said first surface proximate to said at least one passageway and at least partially filling said at least one passageway with the conductive material of said at least one top conductive pad;
    at least partially filling said at least one passageway with the conductive material of said at least one first rear pad; and
    wherein said conductive material of said at least one first rear pad contacts said conductive material of said at least one top conductive pad to establish conductive continuity between said at least one top conductive pad and at least one first rear pad at said first and second surfaces of said substrate.

16. The method of claim 14, wherein said at least one passageway comprises at least two passageways, each with a respective conductive element established therethrough, said conductive elements at said passageways being electrically isolated from one another.

17. The method of claim 14, wherein said deletion area is formed through said second conductive coating by a masking method or by a laser deletion method.

* * * * *